United States Patent [19]
Royer et al.

[11] Patent Number: 5,547,082
[45] Date of Patent: Aug. 20, 1996

[54] COMPONENT TRAY WITH REMOVABLE INSERT

[75] Inventors: Leon D. Royer, Woodbury, Minn.; Thomas Skrtic, Eau Claire; Mark J. Zach, Altoona, both of Wis.

[73] Assignee: Minnesota Mining and Manufacturing Company, St. Paul, Minn.

[21] Appl. No.: 507,601

[22] Filed: Jul. 26, 1995

Related U.S. Application Data

[63] Continuation of Ser. No. 212,063, Mar. 14, 1994, abandoned.

[51] Int. Cl.⁶ .................................................. B65D 73/02
[52] U.S. Cl. ...................... 206/725; 206/722; 206/564
[58] Field of Search .................................. 206/455, 456, 206/564, 722, 724, 725

[56] References Cited

U.S. PATENT DOCUMENTS

| | | | |
|---|---|---|---|
| 2,778,490 | 1/1957 | Emery | 206/332 |
| 4,898,275 | 2/1990 | Skrtic et al. | 206/330 |
| 4,963,405 | 10/1990 | Yamashita et al. | 428/40 |
| 5,076,427 | 12/1991 | Thomson et al. | 206/332 |
| 5,152,393 | 10/1992 | Chenoweth | 206/330 |
| 5,203,450 | 4/1993 | Benetti | 206/564 |
| 5,234,104 | 8/1993 | Schulte et al. | 206/332 |

FOREIGN PATENT DOCUMENTS

| | | | |
|---|---|---|---|
| 4003102 | 8/1991 | Germany | 206/332 |
| 418283 | 1/1992 | Japan | 206/328 |

OTHER PUBLICATIONS

Product Bulletin entitled "Multi–Device Jedec Style Packaging Trays" Minnesota Mining and Manufacturing Company (no date).

Brochure entitled "Transport Medic Jedec Style Integrated Circuit Package Trays" by Minnesota Mining and Manufacturing Company, 1993; Form No. 80–6106–00799–8.

*Primary Examiner*—David T. Fidei
*Attorney, Agent, or Firm*—Gary L. Griswold; Walter N. Kirn; Steven E. Skolnick

[57] ABSTRACT

A tray is provided for transporting components, such as electronic components. The tray includes a frame and an insert that is releasably secured to the frame. The insert has a plurality of pockets formed therein for storing the components. Inserts having a variety of pocket sizes and arrangements may be secured to frames of a standard size.

45 Claims, 2 Drawing Sheets ns, 082

COMPONENT TRAY WITH REMOVABLE INSERT

This is a continuation of Application Ser. No 08/212,063 filed Mar. 14, 1994, now abandoned.

TECHNICAL FIELD

The invention relates to a component tray with a removable insert, and more particularly to a component tray with a removable insert having pockets for retaining electronic components.

BACKGROUND OF THE INVENTION

Component trays are widely used to provide a plurality of electronic components to a placement apparatus, which grasps the component and places it on a circuit board. Each component tray typically includes an outer frame that surrounds a central portion having a plurality of pockets or indentations, and each of the pockets is adapted to hold an electronic component. The unitary trays are typically constructed of injection molded plastic, and are tough and resilient. The pockets of each tray are regularly spaced across the length and width of the tray, and thus the placement apparatus may be programmed to grasp a component at each successive pocket location until a tray is empty. A full tray may then be substituted for the empty tray, and the placement process may continue.

Component trays of the foregoing description are widely used in the electronics industry because they have several benefits. First, each tray may hold dozens of individual components at the same orientation (although at different positions), and thus many components may be transported and used with relative ease. Second, the trays may be stacked without damage to the components, enabling a plurality of trays to be transported together. In such an arrangement, the components are protected from impact and from environmental contaminants (such as dust) that may harm the components. Third, the trays may be used repeatedly, which reduces waste and supply costs. Fourth, trays made of suitable materials may be used in a baking process, whereby the trays and the components are heated in an oven to allow excess moisture to dissipate, or to aid in curing the components.

Although component trays have several benefits, as described above, certain disadvantages are also evident. For example, each component tray includes pockets that are sized to match a particular component. In fact, the tolerance between the component and the walls of the pocket are typically very small, and thus a particular tray is typically useful only for a single size of component. In fact, certain electronics industry standards may require that each type of component be carried in a distinct type of tray, to prevent confusion. Thus, a different sized component would require that hundreds or thousands of new trays be made so that the new component may be supplied to the manufacturer. These new trays can be expensive, which raises the costs that must be borne by the manufacturer. Furthermore, if one or more pockets of a component tray is damaged, the entire tray must be discarded.

In view of the foregoing, it is desirable to provide a component tray that exhibits the advantages of present component trays while minimizing or eliminating the disadvantages. It is also desirable to provide a relatively inexpensive method and apparatus for transporting electronic components in large quantities.

SUMMARY OF THE INVENTION

The present invention provides a tray for storage and delivery of components, comprising a frame, at least one insert having at least one pocket for receiving and holding at least one component, and means for releasably securing said insert to said frame. In one embodiment, the insert includes a plurality of pockets in an aligned column along the length of the insert. In another embodiment, the frame is a rectangular polymeric frame, and the insert is a polymeric insert having a strip portion defining a top surface, the strip portion having longitudinally extending edges, and a plurality of pockets each depending from the strip portion and adapted for receiving and holding a single electronic component.

BRIEF DESCRIPTION OF THE DRAWINGS

The present invention will be further explained with reference to the appended Figures, wherein like structure is referred to by like numerals throughout the several views, and wherein.

DETAILED DESCRIPTION OF THE INVENTION

The present invention includes a component tray including a frame and at least one removable insert secured to the frame and including pockets for retaining individual components. The component tray frame is preferably formed of rigid injection molded plastic, and the insert is preferably formed of an inexpensive, flexible, thin plastic sheet. The tray frame may be constructed in a single standard size, and various inserts may be constructed to include pockets of different sizes. Thus, the same frame may be used to transport components of different sizes, by changing the insert within the frame.

Figure 1:
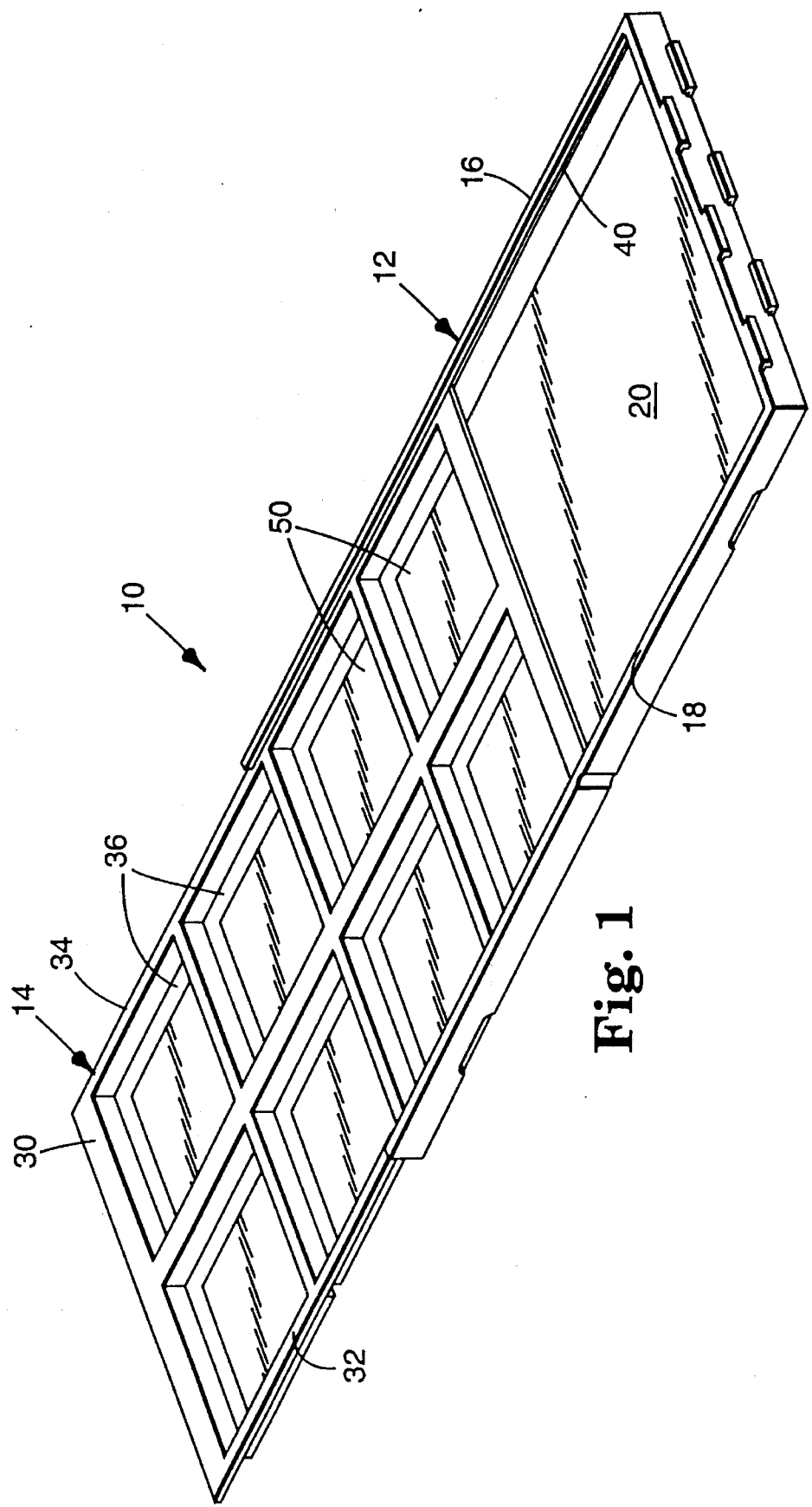
FIG. 1 is a perspective view of the tray including a frame and a removable insert according to the present invention.
Figure 2:
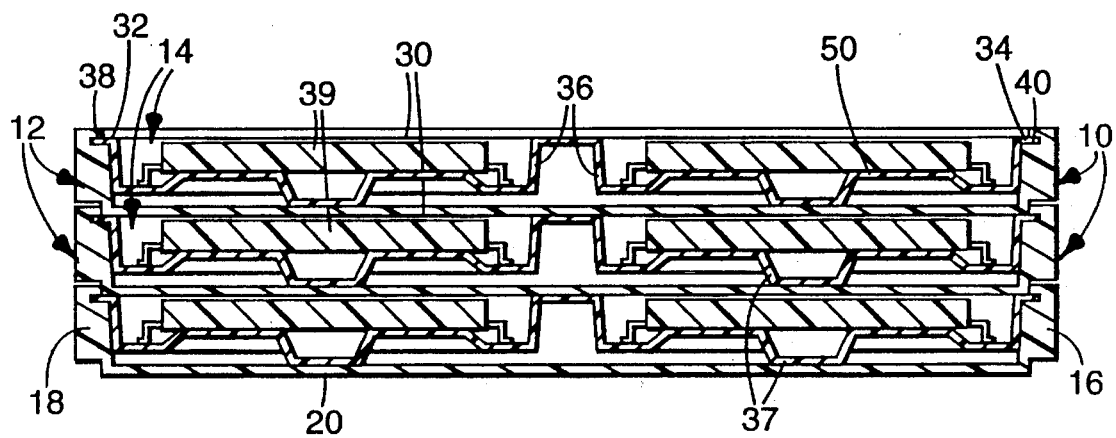
FIG. 2 is a sectional view of a plurality of stacked component trays according to the present invention.
Figure 3:
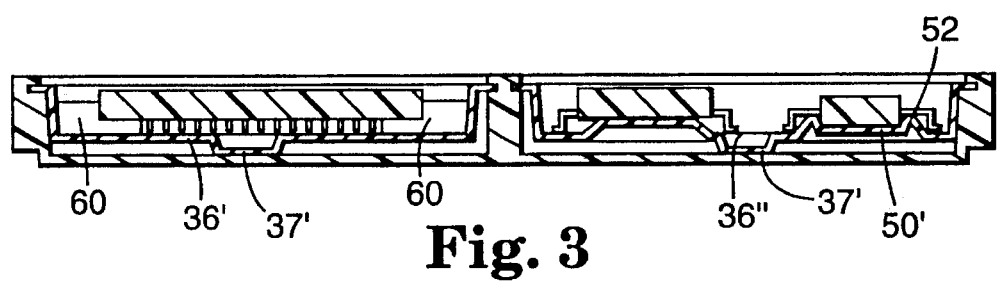
FIG. 3 is a sectional view of a second embodiment of a component tray according to the present invention.

The component tray of the present invention and its constituent parts are illustrated in FIGS. 1 through 3. In broad terms, the inventive tray includes a frame, one or more inserts for carriage by the frame, and means for releasably securing the insert to the frame. Each component will be described in detail below.

FIG. 1 illustrates a component tray 10, including a frame 12 and a removable insert 14. Frame 12 is preferably made of a polymeric material that is thermoset or thermoplasticly formed, although other suitable materials such as steel and aluminum are also contemplated. Suitable polymeric materials include, but are not limited to polyether sulfone, polyvinyl chloride, nylon, polystyrene, polypropylene, polyetherimid, polyester ether ketone, thermoset polyimide, and epoxy novolak. The frame material and design should provide adequate rigidity, durability, and dimensional stability, and preferably are selected to be resistant to the deleterious effects of heating to a temperature of approximately 125° C. (277° F.), to allow the frame, insert, and components to be baked to remove moisture. More preferably, the frame material is resistant to the deleterious effects of heating to a temperature of approximately 125° C. (277° F.) for a period of 24 hours, because some electronic components are baked under these conditions. The material of which frame 12 is comprised is also preferably electrically dissipative, such that static electricity is dispersed along the frame and does not harm the components. Electrical dissipation can be aided by providing an additive in the material used to manufacture the frame, such as carbon black or vanadium pentoxide. Other additives, including but not limited to glass fibers (for reinforcement), colorants, and iron whiskers may be added to the material used to make the frame, or topical treatments such as indium tin oxide, quaternary salts, and antistatic materials may be applied to the frame.

Frame 12 may have any suitable dimensions, and a tray measuring approximately 10.5 cm (4.1 in) wide by 30.4 cm (12.0 in) long by 1.5 cm (0.6 in) thick has been shown to have utility. Frame size may be selected to comply with industry guidelines, such as Joint Electronic Device Engineering Council (JEDEC) standards, or registered outlines of the Electronics Industry Association (E.I.A.). Subject to these guidelines or other applicable guidelines, it is preferred that each user choose a single standard frame size, so that all inserts made for that user (having different sizes of pockets, for example) would fit into the standard frame.

Frame 12 preferably includes at least two side walls 16 and 18, between which the insert may-be placed. Frame 12 may include optional bottom wall 20 that connects together the side walls. A bottom wall is preferable, because it provides added rigidity to the frame and protects from damage the components within the frame stacked beneath it. If a bottom wall is not provided, it is believed that the side walls of the frame should be approximately 4 to 5 times thicker than if a bottom wall is provided, to add rigidity.

The frame may also have means for interlocking superjacent and subjacent frames, to prevent relative motion between frames in a stack. In the embodiment illustrated in FIG. 2, the interlocking means is shown as frames having a bottom portion sized to fit within the top portion of a subjacent frame. However, the interlocking means could instead comprise projections in the frame that are in alignment with holes in a superjacent or subjacent frame, or other suitable structures.

Frame 12 may include other features such as indicia formed on or in the frame, including but not limited to a bar code, identification symbol, manufacturer name, trade mark or trade name, customer name, product information, useful life data, and the like. The frame may have a thickness that is greater than the depth of the pockets in the insert as shown in FIG. 2, such that the pockets are suspended above the bottom wall of the frame, or above a surface if the frame has no bottom wall. Preferably, the bottom of each pocket includes a protrusion 37, as shown in FIGS. 2 and 3, that contacts the bottom wall of the frame 12. Protrusions 37 assist in supporting the insert, which may be useful to prevent the insert from flexing when a component is grasped and removed from a pocket. Protrusions 37 may be provided at one or more locations along the insert—at the center of each pocket, for example. The frame and insert preferably have sufficient clearance surrounding the components to permit mechanical grippers to grasp a component without interfering with the frame or the insert.

The frame may be made in any suitable manner, such as by injection molding. Injection molding generally involves melting a plastic material, and injecting the material into a mold cavity. The material is injected into the mold cavity by an injection unit (such as a piston or plunger mechanism) while the mold is clamped shut. When the plastic material cools and solidifies within the cavity to form a frame, the mold components may be separated and removed, to provide access to the finished frame. The shape of the frame thus takes the shape of the mold cavity. Injection molding is well known in the art, and will not be described in further detail herein.

The insert of the present invention is adapted for carriage by frame 12, which is described above. Insert 14 includes a strip portion 30 having longitudinally extending edges 32 and 34, and at least one pocket 36 depending from the strip portion and adapted for receiving and holding at least one component 39. Preferably, a plurality of pockets are provided in each insert, and each pocket is adapted for holding a single component. The pockets may be provided in one or more aligned columns or rows, or both (i.e. a regular array), and it is typically advantageous to provide a regular array of pockets so that each component within the insert is an equal distance away from each adjacent component. Furthermore, although the pockets need not all be of the same size, identical pockets are typically desirable when the components in a given tray are of the same size. Also, a single frame may be adapted to receive more than one insert as shown in FIG. 3, and could comprise, for example, one insert for each type or size of component.

Insert 14 is preferably sufficiently rigid to prevent components from being dislodged from the pockets thereof, but may be flexible relative to frame 12. It is believed that carrier tapes for electronic components, such as those disclosed in U.S. Pat. Nos. 4,963,405 (Yamashita), 4,898,275 (Skrtic), and 5,152,393 (Chenoweth), the contents of each of which are incorporated by reference herein, may be used as the insert of the present invention, with modifications made as necessary.

The pockets 36 of insert 14 are preferably sized and spaced to position the components at uniform intervals along the length and width of the insert. As stated above relative to the dimensions of frame 12, the insert pocket dimensions and spacing should conform to any applicable industry standard, such as the JEDEC standards, for the particular type of component being transported. Each pocket 36 may also include means for positioning the component within the pocket. For example, the pocket may include a pedestal 50 or 50' projecting from the floor of the pocket, as shown in FIGS. 2 and 3. The pedestal may also include a rail member 52 surrounding part or all of the periphery of the pedestal. Alternatively, the pocket 36' may include corner portions 60 adapted to engage the corners of component, as shown in FIG. 3. Furthermore, the side walls of the pocket may slant toward the center of the pocket at a predetermined draft angle, so that the side walls guide the component into the pocket, and allow the component to be removed from the pocket more easily. Preferably, the insert also comprises projections 37, as described above with reference to FIGS. 2 and 3.

Insert 14 may be constructed of any material that may be formed to hold a component, including plastic, paper, foam, or blown microfibers, and preferably comprises a polymeric material that is adapted to withstand temperatures of approximately 125° C. (277° F.), preferably for periods in excess of 24 hours. Potentially suitable materials include nylon 6, nylon 66, polybutylene terephthalate, polyethylene terephthalate,polyacetal, modified polyphenylene ether, polycarbonate, polyacrylate, polysulfone, polyethersulfone, polyetherimide, or polyethylene sulphide. The insert may include such additives as an antistatic or conductive material, a pigment, or a desiccant, for example.

Insert 14 may be made in any suitable manner, including by injection molding, vacuum forming, or by die molding a polymeric sheet member using a male or female die member, or both. For example, the insert may be formed from a sheet of polymeric material by heating the sheet, vacuum forming the sheet over a male mold (or into a female mold) having molding surfaces adapted to form the structural features of the pocket, cooling the sheet to solidify the insert, and removing the insert from the mold. Any excess material may be trimmed from the insert as necessary to enable the insert to be retained within the frame.

Means are provided for releasably securing the insert to the frame. In the illustrated embodiment, insert 14 is slidingly received within frame 12, with longitudinal edges 32 and 34 being retained by edge slots 38 and 40 formed in frame 12. The thickness of insert edges 32 and 34, and the width of edge slots 38 and 40 may be selected to enable frictional engagement of the respective structures to retain the insert within the tray frame. For example, the thickness of the insert edges 32 and 34 may be approximately 0.381 millimeters (0.015 inches), and the thickness of the edges slots 38 and 40 may be approximately 0.457 millimeters (0.018 inches). Other systems of retaining the insert within the tray frame, including but not limited to snap or interference fit, adhesive retention of the insert by the tray frame, and retention by mechanical fasteners, are intended to be within the scope of the present invention.

The foregoing frame and insert system is believed to give rise to several advantages not present in the component trays of the prior art. For example, a mold for forming inserts may cost approximately $5,000 (U.S.) and take approximately 4 weeks to build, whereas a mold for injection molding trays according to the prior art may cost approximately $120,000 (U.S.) and take approximately 3 months to build. Given that the trays of the prior art may change frequently to accommodate changes in component design, substantial cost savings can be realized by implementing the present system. Furthermore, if manufactured with suitable materials, the component tray of the present invention may be used in baking processes, such as those used in the electronic industries to remove moisture from the components, without adverse affect on the tray.

The present invention has now been described with reference to several embodiments thereof. It will be apparent to those skilled in the art that many changes can be made in the embodiments described without departing from the scope of the invention. Thus, the scope of the present invention should not be limited to the structures described herein, but rather by the structures described by the language of the claims, and the equivalents of those structures.

We claim:

1. A component tray system for storage of electronic components and delivery of the electronic components to a placement apparatus, the system comprising:
   a) a single frame;
   b) a plurality of different inserts, each insert having a plurality of pockets, each pocket adapted for receiving and holding at least one component, wherein each insert is adapted for receiving and holding a component different than the component that each other insert is adapted to receive and hold; and
   c) means for releasably securing each insert to said frame such that the at least one component may be received by a pocket when an insert is releasably secured to said frame.

2. A component tray system for storage of electronic components and delivery of the electronic components to a placement apparatus, the system comprising:
   a) a single rectangular frame;
   b) a plurality of different inserts, each insert comprising a strip portion having longitudinally extending edges, and a plurality of pockets each depending from the strip portion and each adapted for receiving and holding at least one component, wherein the pockets in any one insert are the same but are different than the pockets in each other insert, whereby each insert is adapted for receiving and holding a component different than the component that each other insert is adapted to receive and hold; and
   c) means for releasably securing each insert to said frame by engaging said longitudinally extending edges such that the at least one component may be received by a pocket when an insert is releasably secured to said frame.

3. The component tray system of claim 1 wherein the frame includes a pair of side walls and a bottom wall that connects the side walls.

4. The component tray system of claim 3 wherein each pocket has a bottom surface that includes a protrusion that contacts the bottom wall of the frame.

5. The component tray system of claim 3 wherein each pocket has a bottom surface that contacts the bottom wall of the frame.

6. The component tray system of claim 1 wherein the plurality of pockets in any one insert are identical and are spaced at uniform intervals along the length and width of the insert.

7. The component tray system of claim 6 wherein the plurality of pockets in each one insert are the same but are different than the pockets in each other insert.

8. The component tray system of claim 1 wherein the frame is a peripheral frame with an open top.

9. The component tray system of claim 2 wherein the frame includes a pair of side walls and a bottom wall that connects the side walls.

10. The component tray system of claim 9 wherein each pocket has a bottom surface that includes a protrusion that contacts the bottom wall of the frame.

11. The component tray system of claim 9 wherein each pocket has a bottom surface that contacts the bottom wall of the frame.

12. The component tray system of claim 2 wherein the frame is a peripheral frame with an open top.

13. A component tray system for storage of electronic components and delivery of the electronic components to a placement apparatus, the system comprising:
   a) a plurality of component trays arranged in a stacked configuration, each tray comprising
      i) a single frame;
      ii) a plurality of different inserts, each insert having a plurality of pockets, each pocket adapted for receiving and holding at least one component, wherein each insert is adapted for receiving and holding a component different than the component that each other insert is adapted to receive and hold; and
      iii) means for releasably securing each insert to said frame; and
   b) means for interlocking superjacent and subjacent frames.

14. The component tray system of claim 13, wherein each insert includes a plurality of pockets in an aligned column along the length of the insert.

15. The component tray system of claim 14, wherein at least one of the plurality of inserts includes at least two columns of pockets.

16. The component tray system of claim 13, wherein each pocket in at least one of the plurality of inserts is adapted to hold a single component therein.

17. The component tray system of claim 13, and further including one electronic component within each pocket of at least one of the plurality of inserts for at least one of the plurality of component trays.

18. The component tray system of claim 13, wherein each pocket in at least one of the plurality of inserts for at least one of the plurality of component trays comprises means for positioning the component within the pocket.

19. The component tray system of claim 13 wherein each insert in at least one of the plurality of component trays comprises a strip portion having longitudinally extending edges, and a plurality of pockets each depending from the strip portion and adapted for receiving and holding a component, wherein the pockets in any one insert are the same but are different than the pockets in each other insert, whereby each insert is adapted for receiving and holding a component different than the component that each other insert is adapted to receive and hold.

20. The component tray system of claim 13 wherein each frame for each of the component trays includes a pair of side walls and a bottom wall that connects the side walls.

21. The component tray system of claim 20 wherein each pocket has a bottom surface that includes a protrusion that contacts the bottom wall of the frame to which that insert is releasably secured.

22. The component tray system of claim 20 wherein each pocket has a bottom surface that contacts the bottom wall of the frame to which that insert is releasably secured.

23. The component tray system of claim 13 wherein each frame for each of the component trays is a peripheral frame with an open top.

24. The component tray system of claim 1, wherein each insert includes a plurality of pockets in an aligned column along the length of the insert.

25. The component tray system of claim 24, wherein at least one of the plurality of inserts includes at least two columns of pockets.

26. The component tray system of claim 1, wherein each pocket is adapted to hold a single component therein.

27. The component tray system of claim 1, wherein said tray includes at least two insets oriented side by side and both adapted to be releasably secured to the frame.

28. The component tray system of claim 1, wherein both the frame and the plurality of inserts are constructed of a material that is adapted to withstand a temperature of approximately 125° C. for a period of 24 hours.

29. The component tray system of claim 1, and further including one electronic component within each pocket of at least one of the plurality of inserts.

30. The component tray system of claim 1, wherein each pocket in at least one of the plurality of inserts comprises means for positioning the component within the pocket.

31. The component tray system of claim 30, wherein the positioning means comprises a pedestal raised above a floor of the pocket.

32. The component tray system of claim 31, wherein said pedestal includes a rail around the periphery of the pedestal to prevent the component from moving with respect to the pedestal.

33. The component tray system of claim 30, wherein the positioning means comprises corner portions adapted to engage corners of the component.

34. The component tray system of claim 1, wherein each insert includes a plurality of protrusions for supporting the insert against the frame.

35. The component tray system of claim 2, wherein each insert includes a plurality of pockets in an aligned column along the length of the insert.

36. The component tray system of claim 35, wherein at least one of the plurality of inserts includes at least two columns of pockets.

37. The component tray system of claim 2, wherein each pocket is adapted to hold a single component therein.

38. The component tray system of claim 2, wherein said tray includes at least two inserts oriented side by side and both adapted to be releasably secured to the frame.

39. The component tray system of claim 2, wherein both the frame and each insert are constructed of a material that is adapted to withstand a temperature of approximately 125° C. for a period of 24 hours.

40. The component tray system of claim 2, and further including one electronic component within each pocket of at least one of the plurality of inserts.

41. The component tray system of claim 2, wherein each pocket in at least one of the plurality of insert comprises means for positioning the component within the pocket.

42. The component tray system of claim 41, wherein the positioning means comprises a pedestal raised above a floor of the pocket.

43. The component tray system of claim 42, wherein said pedestal includes a rail around the periphery of the pedestal to prevent the component from moving with respect to the pedestal.

44. The component tray system of claim 41, wherein the positioning means comprises corner portions adapted to engage corners of the component.

45. The component tray system of claim 2, wherein each insert includes a plurality of protrusions for supporting the insert against the frame.

* * * * *